US006769924B1

(12) United States Patent
Korsunsky et al.

(10) Patent No.: US 6,769,924 B1
(45) Date of Patent: Aug. 3, 2004

(54) ELECTRICAL CONNECTOR HAVING A RELEASABLE COVER

(75) Inventors: Iosif R. Korsunsky, Harrisburg, PA (US); Andrew Cheng, Diamond Bar, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/437,636

(22) Filed: May 13, 2003

(51) Int. Cl.[7] .................................................. H01R 12/00

(52) U.S. Cl. ............................. 439/83; 439/74; 29/860; 29/854; 29/878

(58) Field of Search ............................ 439/83, 876, 70, 439/74, 79, 940, 41, 42; 29/854–860, 876–878; 174/261

(56) References Cited

U.S. PATENT DOCUMENTS 5,641,945 A * 6/1997 Abe et al. .................... 174/261
5,702,255 A * 12/1997 Murphy et al. ............... 439/71
5,716,222 A * 2/1998 Murphy ....................... 439/91
5,730,606 A * 3/1998 Sinclair ...................... 439/70
5,746,608 A * 5/1998 Taylor ........................ 439/70
6,042,389 A 3/2000 Lemke et al.
6,093,035 A 7/2000 Lemke et al.
6,142,792 A * 11/2000 Yang .......................... 439/70
6,155,845 A * 12/2000 Lin et al. ..................... 439/83
6,168,449 B1 * 1/2001 Huang et al. ............... 439/259
6,471,526 B1 * 10/2002 Harper, Jr. .................. 439/83
6,573,458 B1 * 6/2003 Matsubara et al. ......... 174/260
6,623,284 B1 * 9/2003 Korsunsky .................. 439/83
2003/0203660 A1 * 10/2003 Kassa et al. ................ 439/65

* cited by examiner

*Primary Examiner*—Tho D. Ta
*Assistant Examiner*—L Tsukeman
(74) *Attorney, Agent, or Firm*—Wei Te Chung

(57) ABSTRACT

An electrical connector (1) having a cover (5) mounted thereon is disclosed in accordance with the present invention. The connector includes a connector body (2) defining a passageway (20) in a mounting surface (202) with a contact (3) received therein. The contact has a tail portion (304) adapted to be electrically connected to a circuit substrate (6). The cover has a pair of legs (52) extending into the passageway and forming an opening (524) adjacent to the mounting surface of the connector body. The tail portion of the contact terminates in the opening. A fusible element (4) has a portion disposed in the opening and fused to the tail portion of the contact.

20 Claims, 4 Drawing Sheets

50
5
200
302
1
20
2
3
52
520
202
3
3
304
522
304
3040
6
4
524
4

ELECTRICAL CONNECTOR HAVING A RELEASABLE COVER

BACKGROUND OF THE INVENTION

1. Field of the Invention

The present invention relates to an electrical connector, and particularly to an electrical connector mounted to a circuit substrate by use of solder balls attached to contacts.

2. Description of Related Art

Electrical connectors are commonly mounted on a printed circuit board (PCB) in an electronic device for implementing different functions. In order to meet the miniature requirements, the overall side of the electronic device becomes smaller and smaller. Consequently, the PCB mounted within the device becomes small as well. However, while the dimension of the device decreases, the functions of the device increase. As such, there is a need to install more and more connectors within a limited area of the PCB. In order to mount more and more connectors on the PCB while without increasing the surface area. The dimension of the connector must be reduced. This means the pitch between terminals within the connector have to reduce as well. As such, a high-density connector is required.

The trend of miniaturization has also been meet by using surface mount techniques (SMT) for mounting the connectors on the PCB. The confluence of the use of SMT and the required fine pitch of the connectors has resulted in approaching the limits of SMT for high volume, low cost operations. Reducing the pitch of the terminals increases the risk of bringing adjacent solder pads or terminals during reflow of the solder paste.

The use of ball grid array (BGA) for mounting the connector on the PCB has been developed. In a BGA connector, spherical solder balls attached to the contacts are positioned on conductive pads of a PCB to which a layer of solder paste has been applied, typically by use of a screen or mask. The connector and the PCB are then heated to a temperature at which the solder paste and at least a portion or all of the solder ball melt and the solder ball is fused to the conductive pad on the PCB. The use of BGA in connecting the electrical connector to the PCB has many advantages. It is important for most situations that the board-engaging surfaces of the solder balls are coplanar to form a substantially flat mounting interface, so that in the final application the balls will reflow and solder evenly to the planar PCB. Coplanarity of the solder ball is influenced by the size of the solder ball and its positioning on the connector. The final size of the ball is dependent on the total volume of solder initially available in both the solder paste and the solder balls. How to apply solder balls to the connector contacts for meeting the requirement of coplanarity is really a challenge to the manufacturer.

Connectors having solder balls attached to contacts thereof are disclosed in U.S. Pat. Nos. 6,093,035, 6,024,584, 6,079,991, 6164983, 6,325,644 and 6,042,389 all issued to Lemke et al.

The connector disclosed in U.S. Pat. No. 6,093,035 comprises an insulative housing defining a passageway extending from a mating surface toward a mounting surface thereof. A well is formed in the mounting surface in alignment with and communication with the passageway. A pin-type terminal is received in the passageway with a terminal portion extending into the well where a solder ball is fused to the terminal portion. The well locates the position of the solder ball in the lateral X-Y directions prior to attachment of the solder ball onto the terminal. The terminal portion does not touch the solder ball and thereby influence its Z direction location. However, fusing of the solder ball onto the terminal portion is assured by having a relatively uniform and adequate amount of solder, from solder paste placed in the well. Any variation in the distance between the terminal and the solder ball is absorbed by the variable volume of the solder paste placed in the well. Therefore, the position of the solder ball in the Z direction is ensured with respect to the mounting surface of the housing and the distance of the solder ball from the terminal portion of the terminal.

The connector disclosed in U.S. Pat. No. 6,042,389 includes a connector body defining a passageway extending from a mating surface toward a mounting surface thereof. A well is formed in the mounting surface in alignment with and communication with the passageway. A pin-type terminal is "bottomed" in the passageway by inserting the terminal until bottom shoulders engage passage bottom surfaces, thereby locating the terminal in a vertical downward position. The terminal has a solder tab extending into the well. A solder ball is positioned in the well before it is attached to the solder tab of the terminal. In order to retain the terminal in the passage, the well receives a large amount of solder paste placed therein. After reflow to attach the solder ball onto the solder tab of the terminal, the solder ball and the solder paste disposed in the well form a mass that fills and conforms to the shape of the well. As a result, the solder mass engages the bottom of the well to thereby prevent movement of the terminal upward out of the passage.

However, there exists a problem in the above-mentioned patents that since a large amount of the solder paste is placed in the well, wicking of the solder from the well up the terminal is significantly serious when the connector is subjected to a reflow process to fuse the solder ball onto the terminal. Although the terminal is provided with a coating or/and thermal break structure on a medial portion thereof, the solder wicking is still a problem since there exists a gap between the terminal and the passageway.

Hence, an improved electrical connector is required to overcome the disadvantages of the related art.

SUMMARY OF THE INVENTION

Accordingly, it is an object of the present invention to provide an electrical connector having a releasable cover for conveniently and reliably attaching fusible elements to pin-type terminals thereof It is another object of the present invention to provide an electrical connector having a releasable cover for suction by a vacuum pick up device, thereby facilitating placement of the connector onto a circuit substrate.

In order to achieve the objects set forth, an electrical connector having a releasable cover attached thereto is disclosed in accordance with the present invention. The connector comprises a connector body defining a passageway in a mounting surface with a contact received therein. The contact has a tail portion adapted to be electrically connected to a circuit substrate. The cover has a top plate disposed on the connector body for suction by a vacuum pick up device and a pair of legs downwardly extending into the passageway. The legs form an opening adjacent to the mounting surface with the tail portion of the contact terminating therein. A fusible element has a portion disposed in the opening and fused to the tail portion of the contact.

Other objects, advantages and novel features of the invention will become more apparent from the following detailed description when taken in conjunction with the accompanying drawings.

DETAILED DESCRIPTION OF THE INVENTION

Reference will now be made in detail to the preferred embodiment of the present invention.

Figure 1:
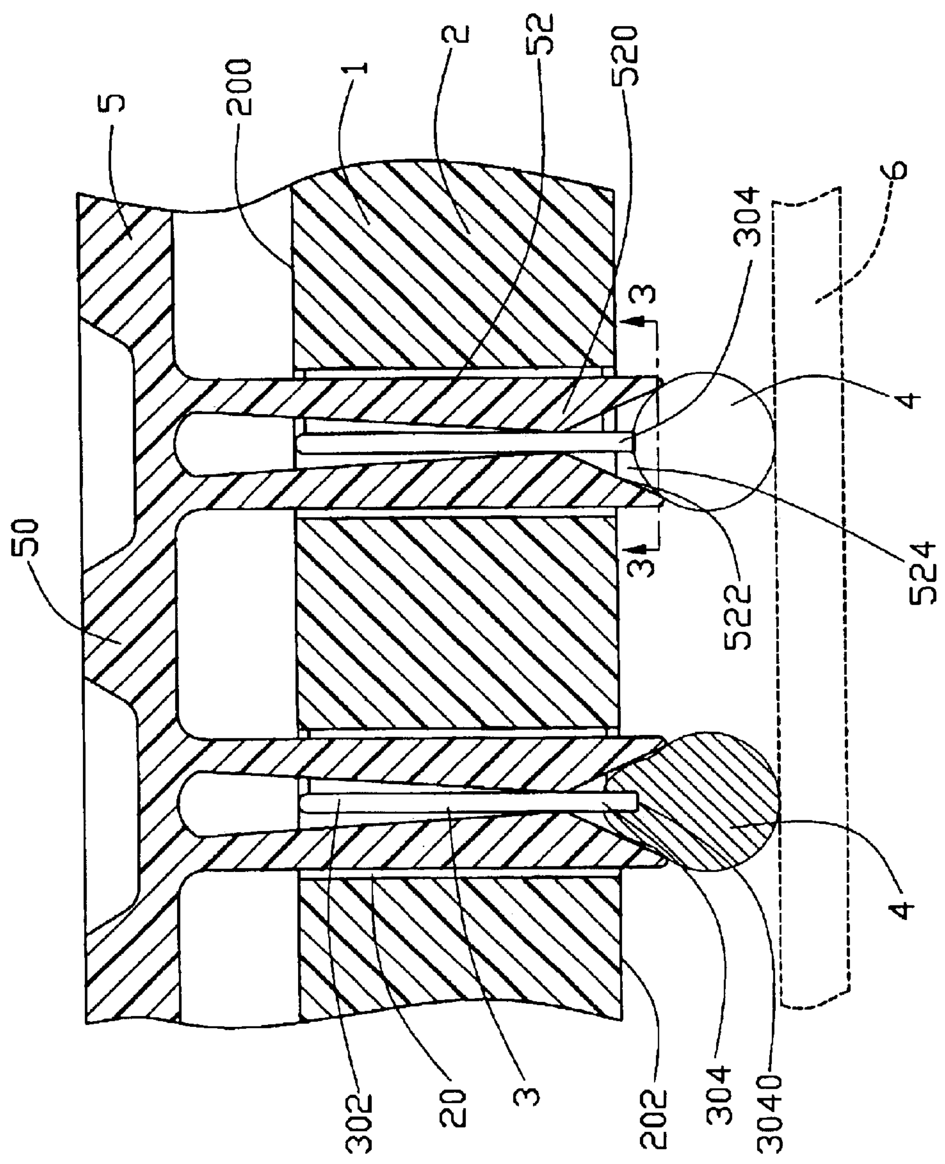
FIG. 1 is a partially cut away cross-sectional view of an electrical connector having a releasable cover attached thereto in accordance with a first embodiment of the present invention.
Figure 2:
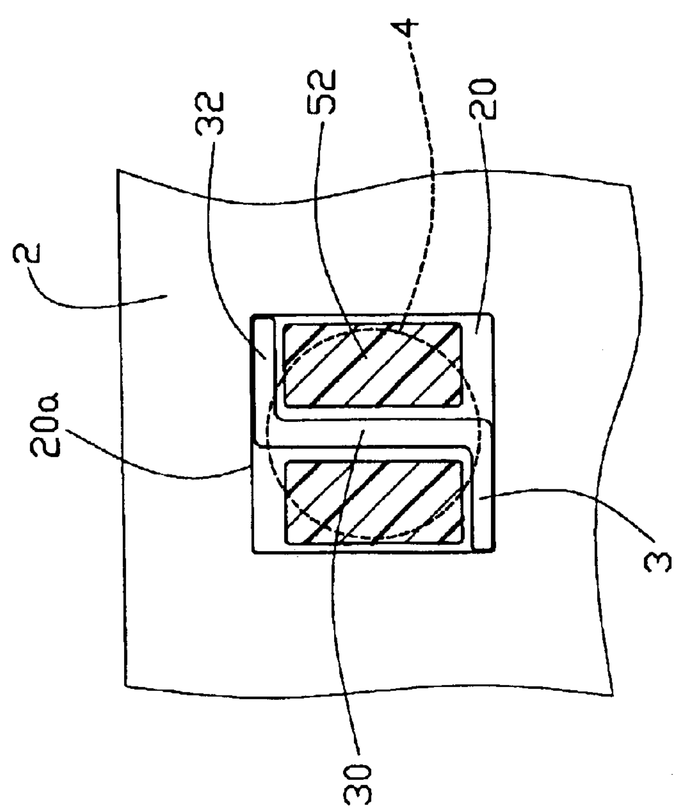
FIG. 2 is a partially cut away cross-sectional view of the electrical connector with the cover attached thereto in an orientation perpendicular to that shown in FIG. 1.

FIGS. 1 and 2 show an electrical connector 1 having a releasable cover 5 mounted thereon in accordance with a first embodiment of the present invention. The electrical connector 1 comprises an insulating housing 2 defining a passageway 20 with a terminal 3 received therein. The passageway 20 extends from a top mating surface 200 to a bottom mounting surface 202 of the housing 2 and is generally of a rectangular structure, as best shown in FIG. 2.

Figure 4:
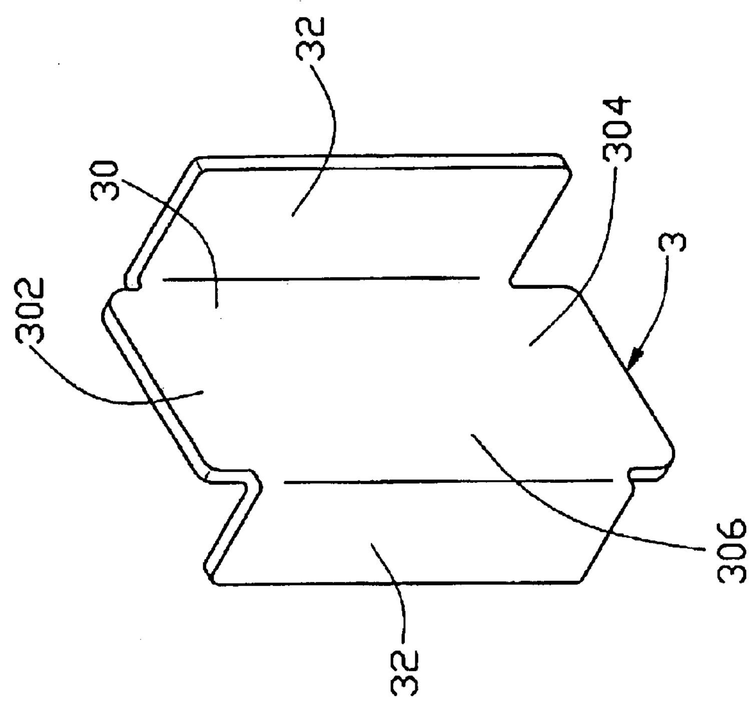
FIG. 4 is an enlarged perspective view of a terminal shown in FIGS. 1 and 2.

Referring to FIG. 4 in conjunction with FIGS. 1 and 2, the terminal 3 is preferably of a Z-shaped structure but those skilled in the art will appreciate that it may be possible to modify the terminal 3 having other shapes. The terminal 3 has a planar body 30 and a pair of wings 32 extending laterally from opposite side edges of the planar body 30 in opposite directions. The wings 32 engage with sidewalls 20*a* of the passageway 20 in which the terminal 3 is installed to provide enough retention for the terminal 3 in the housing 2. The body 30 has an engaging portion 302 adjacent to the mating surface 200 of the housing 2 for engaging with a deflectable terminal of a complementary connector (not shown), a tail portion 304 extending in a direction away from the engaging portion 302 to locate adjacent the mounting surface 202 of the housing 2 and a medial portion 306 interconnecting the engaging portion 302 with the tail portion 304.

The releasable cover 5 is preferably formed as an integral one piece by molding an insulative polymer. Preferably the polymer is one capable of withstanding surface mount techniques (SMT) reflow temperatures, for example, a liquid crystal polymer. The cover 5 includes a top plate 50 disposed on the mating surface 200 of the housing 2 and a pair of legs 52 downwardly extending from the top plate 50 to be inserted into the passageway 20. The legs 52 are separated from each other by the planar body 30 of the terminal 3 and substantially fill the passageway 20 adjacent to the mounting surface 202 of the housing 2 so as to surround the tail portion 304 of the terminal 3. In the preferred embodiment of the present invention, the legs 52 form a pair of abutments 520 to snugly abut against opposite sides of the planar body 30 between the wings 32 adjacent the mounting surface 202. The legs 52 have opposite oblique surfaces 522 to form an opening 524 adjacent to the mounting surface 202 of the housing 2. The tail portion 304 of the terminal 3 extends into the opening 524 and has a free end 3040 received in the opening 524. A fusible element, preferably a solder ball 4 is positioned in the opening 524 and fused onto the tail portion 304, as will be described below.

Figure 3:
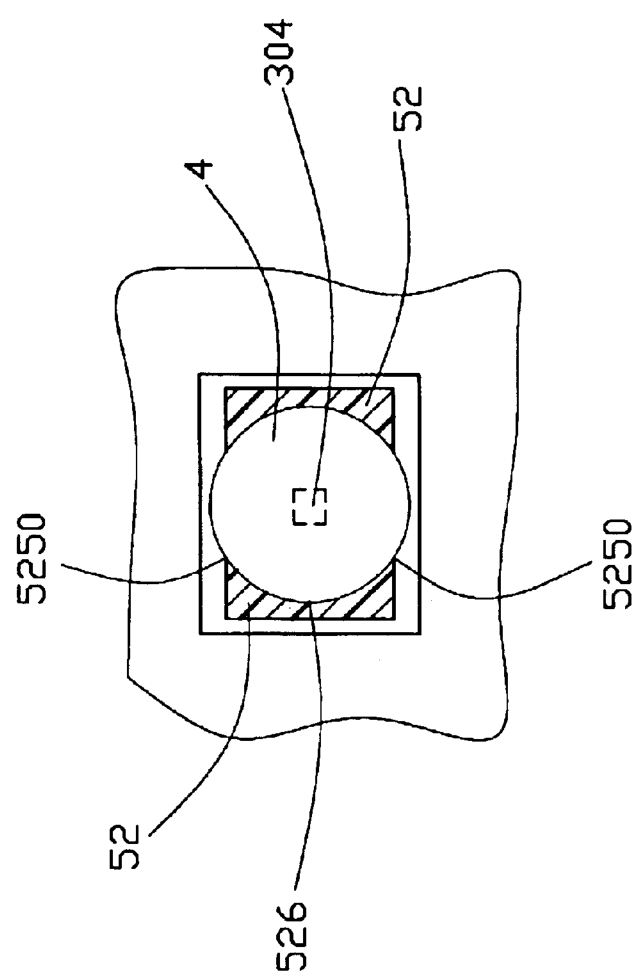
FIG. 3 is a partially cut away cross-sectional view taken along section line 3—3 in FIG. 1.

Referring to FIG. 3 in conjunction with FIG. 1, each of the legs 52 has an end 525 with two engaging points 5250 contacting with the solder ball 4. In the preferred embodiment with the present invention, the end 525 has a curved surface 526 connecting the two engaging points 5250 and conforming to the contour of the solder ball 4 to contact with the solder ball 4. It is noted that the solder ball 4 can also be positioned by one leg 52 and the tail portion 304 of the terminal 3.

After placement of the solder ball 4 in the opening 524, the connector 1 is subjected to a reflow process to fuse the solder ball 4 onto the tail portion 304 of the terminal 3. The solder ball 4 has a portion exposed out of the opening 524 for being soldered to a circuit substrate 6, schematically shown in phantom lines in FIGS. 1 and 5.

Before the connector 1 is soldered to a conductive pad (not shown) of the circuit substrate 6 to which a layer of solder paste has been applied, a vacuum pick up device (not shown) is provided for suction the top plate 50 of the cover 5 to properly position the solder ball 4 on the solder paste. The connector 1 and the circuit substrate 6 are then heated to a temperature at which the solder paste and at least a portion or all of the solder ball 4 melt and the solder ball 4 is fused to the underlying conductive pad on the circuit substrate 6, whereby a reliable electrical connection is established between the connector 1 and the circuit substrate 6 via the solder ball 4. The cover 5 is finally removed from the connector 1 after the connector 1 is soldered on the circuit substrate 6.

Figure 5:
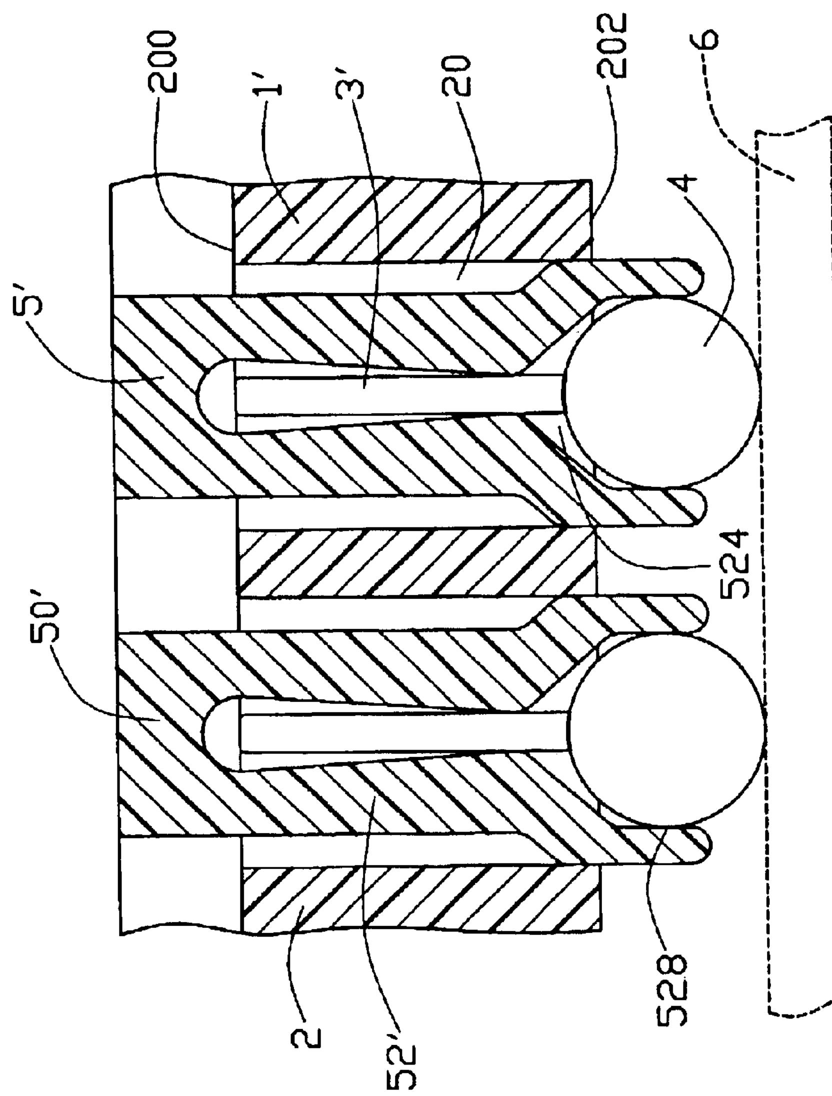
FIG. 5 is a partially cut away cross-sectional view of an electrical connector having a releasable cover attached thereto in accordance with a second embodiment of the present invention.

Referring to FIG. 5, an electrical connector 1' having a releasable cover 5' assembled thereto in accordance with a second embodiment of the present invention is shown. The connector 1' has a configuration substantially identical to that of the connector 1 except for the terminal 3'. The terminal 3' is a rectangular shape with the wings 32 removing from the terminal 3. The terminal 3' engages with the sidewalls 20*a* of the passageway 20 via opposite edges thereof The cover 5' has a top plate 50' disposed on the mating surface 200 of the connector 1' and a pair of legs 52' extending downwardly from the top plate 50' to be inserted into the passageway 20. The legs 52' are substantially the same as the legs 52 of the cover 5 except that the legs 52' further define opposite surfaces 528 substantially perpendicular to the mounting surface 202 of the housing 2 with the solder ball 4 exactly positioned therebeween.

It is noted that since the connector 1 is a high-density connector with a number of passageways 20 defined in the mating surface 200 thereof, the vacuum pick up device can not directly suck the connector 1 onto the circuit substrate 6. The cover 5 (5') of the present invention also solves this problem with the top plate 50 (50') disposed on the mating surface 200 of the connector 1. Thus, an additional pick up cap used for the connector 1 for suction by the vacuum pick up device is omitted.

It is appreciated that the cover 5 (5') defines an opening 524 adjacent to the mounting surface 202 of the housing 2 for pre-positioning the solder ball 4 before the solder ball 4 is fused onto the terminal 3. It is also appreciated that the legs 52 (52') of the cover 5 (5') have abutments 520 snugly abutting against the terminal 3 adjacent to the mounting surface 202 of the housing 2 to surround the terminal portion 304, thereby obtaining anti-wicking function when the solder ball 4 is fused to the terminal 3 and then is soldered to the circuit substrate 6. The legs 52 (52') may also provide anti-solder wicking coatings on inner surfaces thereof to further prevent solder wicking from the tail portion 304 toward the engaging portion 302 of the terminal 3. One preferred material for this purpose is nickel plating.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the fill extent indicated by the broad general meaning of the terms in which the appended claims are expressed.

What is claimed is:

1. An electrical connector assembly, comprising:

a connector body defining a passageway extending from a top mating surface to a bottom mounting surface thereof;

a contact received in the passageway and having a tail portion adapted to be electrically connected to a circuit substrate;

a cover assembled to the connector body and having a pair of legs downwardly extending into the passageway and surrounding the contact adjacent to the mounting surface, the legs defining therebetween an opening at free ends thereof; and a fusible element attached to the tail portion of the contact with a portion disposed in the opening.

2. The electrical connector assembly as claimed in claim 1, wherein the opening is formed by two opposite oblique surfaces of the legs at the free ends thereof.

3. The electrical connector assembly as claimed in claim 1, wherein the fusible element comprises solder.

4. The electrical connector assembly as claimed in claim 3, wherein the solder is substantially in the form of a ball.

5. The electrical connector assembly as claimed in claim 3, wherein the legs have abutments snugly abutting against the contact adjacent to the mounting surface for resisting solder wicking.

6. The electrical connector assembly as claimed in claim 1, wherein the legs have opposite surfaces substantially perpendicular to the mounting surface of the connector body, and the fusible element is positioned between the opposite surfaces of the legs.

7. The electrical connector assembly as claimed in claim 1, wherein the contact has an engaging portion adjacent to a mating surface of the connector body for electrically engaging with a mating component and a medial portion interconnecting the engaging portion with the tail portion.

8. The electrical connector assembly as claimed in claim 7, wherein the engaging portion, the medial portion and the tail portion of the contact are in a common plane to form a planar body.

9. The electrical connector assembly as claimed in claim 8, wherein the contact has a wing extending laterally from an edge of the planar body for engaging with sidewalls of the passageway.

10. The electrical connector assembly as claimed in claim 8, wherein the contact has a pair of wings extending laterally from edges of the planar body in opposite directions for engaging with sidewalls of the passageway.

11. The electrical connector assembly as claimed in claim 1, wherein the tail portion of the contact is received in the opening.

12. The electrical connector assembly as claimed in claim 11, wherein the tail portion of the contact is in contact with the fusible element when the fusible element is positioned in the opening.

13. The electrical connector assembly as claimed in claim 1, wherein the opening defined between the legs is generally of a reversed bowl-like shape.

14. An electrical connector assembly, comprising:

a connector body defining a passageway in a mounting surface thereof;

a contact received in the passageway, the contact having a tail portion adapted to be electrically connected to a circuit substrate;

a cover assembled to the connector body and having a leg extending into the passageway, the leg and the tail portion together defining a space adjacent to the mounting surface of the connector body; and a fusible element positioned in the space and fused to the tail portion of the contact.

15. The electrical connector assembly as claimed in claim 14, wherein the leg has an abutment snugly abutting against the contact adjacent to the mounting surface for resisting solder wicking.

16. An electrical connector assembly, comprising:

a connector body defining a passageway in a mounting surface with a contact received therein, the contact including a tail portion adapted to be electrically connected to a circuit substrate;

a removable cover assembled to the connector body and having a leg extending into the passageway;

the leg and the tail portion respectively having a free end located adjacent to the mounting surface; and a fusible element positioned by the free ends of the leg and the tail portion, and fused to the tail portion of the contact via assistance of guidance of the free end of said leg.

17. The electrical connector assembly as claimed in claim 16, wherein said cover is removed from the connector body after the fusible element is fused to the tail portion of the contact.

18. The electrical connector assembly as claimed in claim 16, wherein the fusible element is substantially in the form of a solder ball, and the free end of the leg has a curved surface conforming to the contour of the solder ball to contact with the solder ball.

19. An electrical connector assembly, comprising:

a connector body defining a passageway in a mounting surface with a contact received therein;

the contact having an engaging portion for engaging with a mating contact and a tail portion for electrically connecting to a circuit substrate;

a cover assembled to the connector body and having a pair of legs extending into the passageway and surrounding the contact adjacent to the mounting surface;

a formed body of solder fused to the tail portion of the contact; and said legs having coatings formed on inner surfaces thereof for resisting solder wicking from the tail portion to the engaging portion of the contact.

20. The electrical connector assembly as claimed in claim 19, wherein the coating comprises a layer of nickel.

* * * * *